United States Patent
Zheng et al.

(10) Patent No.: US 9,190,395 B2
(45) Date of Patent: Nov. 17, 2015

(54) GAN-BASED LED

(71) Applicant: XIAMEN SANAN OPTOELECTRONICS TECHNOLOGY CO., LTD., Xiamen (CN)

(72) Inventors: Jiansen Zheng, Xiamen (CN); Suhui Lin, Xiamen (CN); Kangwei Peng, Xiamen (CN); Lingyuan Hong, Xiamen (CN); Anhe He, Xiamen (CN)

(73) Assignee: Xiamen Sanan Optoelectronics Technology Co., Ltd., Xiamen (CN)

( * ) Notice: Subject to any disclaimer, the term of this patent is extended or adjusted under 35 U.S.C. 154(b) by 0 days.

(21) Appl. No.: 14/536,324

(22) Filed: Nov. 7, 2014

(65) Prior Publication Data

US 2015/0060879 A1     Mar. 5, 2015

Related U.S. Application Data

(63) Continuation of application No. PCT/CN2013/077608, filed on Jun. 21, 2013.

(30) Foreign Application Priority Data

Jun. 21, 2012    (CN) .......................... 2012 1 0206025

(51) Int. Cl.
*H01L 25/13*      (2006.01)
*H01L 33/10*      (2010.01)
*H01L 33/40*      (2010.01)
*H01L 33/60*      (2010.01)
*H01L 33/14*      (2010.01)
*H01L 33/32*      (2010.01)

(52) U.S. Cl.
CPC ................ *H01L 25/13* (2013.01); *H01L 33/10* (2013.01); *H01L 33/405* (2013.01); *H01L 33/60* (2013.01); *H01L 33/14* (2013.01); *H01L 33/32* (2013.01); *H01L 2924/0002* (2013.01)

(58) Field of Classification Search
CPC ......... H01L 33/46; H01L 33/20; H01L 33/42; H01L 33/405; H01L 33/10; H01L 25/13; H01L 33/60; H01L 33/32; H01L 33/14
See application file for complete search history.

(56) References Cited

U.S. PATENT DOCUMENTS

| | | | |
|---|---|---|---|
| 6,787,383 B2 * | 9/2004 | Ikeda et al. ...................... | 438/44 |
| 8,399,906 B2 * | 3/2013 | Tsai et al. ....................... | 257/103 |
| 2002/0121643 A1 * | 9/2002 | Mizuno et al. .................. | 257/98 |
| 2005/0104080 A1 * | 5/2005 | Ichihara et al. ................ | 257/98 |
| 2006/0033113 A1 * | 2/2006 | Lee et al. ........................ | 257/80 |

(Continued)

*Primary Examiner* — Jarrett Stark
*Assistant Examiner* — Bitew Dinke
(74) *Attorney, Agent, or Firm* — Syncoda LLC; Feng Ma

(57) ABSTRACT

A GaN-based LED includes a substrate; an epitaxial layer over the substrate; a current spreading layer over a P-type layer; and a P electrode over the current spreading layer. The epitaxial layer includes the P-type layer, a light-emitting area, and an N-type layer. An annular reflecting layer and a metal reflecting layer are formed between the P electrode and the epitaxial layer. The geometric center vertically corresponds to the P electrode; the annular reflecting layer is formed between the current spreading layer and the P-type layer; the metal reflecting layer is formed between the current spreading layer and the P electrode; and a preset distance is arranged between the annular reflecting layer and the metal reflecting layer. The annular reflecting layer and the metal reflecting layer reduce light absorption of the P electrode and improve light extraction efficiency.

20 Claims, 6 Drawing Sheets

(56) References Cited

U.S. PATENT DOCUMENTS

| | | | |
|---|---|---|---|
| 2008/0185606 A1* | 8/2008 | Sano et al. | 257/98 |
| 2009/0278163 A1* | 11/2009 | Sakamoto et al. | 257/101 |
| 2010/0123118 A1* | 5/2010 | Hu et al. | 257/13 |
| 2010/0140635 A1* | 6/2010 | Ibbetson et al. | 257/98 |
| 2010/0176413 A1* | 7/2010 | Lin et al. | 257/98 |
| 2010/0176419 A1* | 7/2010 | Lin et al. | 257/103 |
| 2010/0320478 A1* | 12/2010 | Lin et al. | 257/79 |
| 2011/0049472 A1* | 3/2011 | Kim et al. | 257/13 |
| 2011/0114980 A1* | 5/2011 | Lee et al. | 257/98 |
| 2011/0233589 A1* | 9/2011 | Kim et al. | 257/98 |
| 2012/0098009 A1* | 4/2012 | Kim et al. | 257/98 |
| 2014/0008660 A1* | 1/2014 | Jorgenson | 257/76 |

\* cited by examiner

GAN-BASED LED

CROSS-REFERENCE TO RELATED APPLICATIONS

The present application is a continuation of, and claims priority to, PCT/CN2013/077608 filed on Jun. 21, 2013, which claims priority to Chinese Patent Application No. CN 201210206025.8 filed on Jun. 21, 2012. The disclosures of these applications are hereby incorporated by reference in their entirety.

BACKGROUND

Existing blue and green LEDs adopt GaN-based III-V component semiconductor material. Most light is transmitted from the P-type layer due to small hole concentration of P-GaN layer of the GaN-based LED epitaxial wafer and thin P-type layer. P-type layer's inevitable absorption of light results in low LED chip external quantum efficiency and greatly decreases the LED light-emitting efficiency. Adoption of ITO layer as the current spreading layer can enhance the transmittance. However, the LED voltage is high and shortens the service life. In addition, under impressed voltage, the LED service life is shortened due to uneven current diffusion, which leads to large current density in some areas. In short, the existing GaN-based LED has relatively low external quantum efficiency (EQE) due to the non-uniform current distribution and the electrode's absorption of light reflected on it.

Therefore, many studies are made on improving LED's light-emitting efficiency, mainly concerning such technologies as pattern substrate technology, distributed current blocking layer (i.e., current blocking layer), distributed Bragg reflector (DBR) structure, transparent substrate, surface roughening, photonic crystal technology, etc.

Referring to FIG. 1, a conventional LED structure, comprising a substrate 100, a bottom-up-laminated N-type layer 101, a light-emitting area 102, a P-type layer 103, a metal reflecting layer 104, a current spreading layer 105, a P electrode 106 and an N electrode 107 on the exposed surface of the N-type layer 101. The metal reflecting layer 104 (typically, Al or Ag material) reflects part of light emitted by the light-emitting layer and extracts light sideways, as shown in Light 1*a*. However, it may still be impossible or difficult for some light exit from the side or above, as shown in Light 1*b*, making the light emitted from light-emitting layer not efficiently extracted, resulting in loss of light and affecting the light-emitting efficiency of the chip.

SUMMARY

The present disclosure relates to a GaN-based HBLED with dual reflecting layers. A dual reflecting layer structure is formed by adding an annular reflecting layer and a metal reflecting layer between the LED epitaxial layer and the P electrode, thus effectively extracting the light emitted from the light-emitting layer, eliminating light absorption of the P electrode and improving light extraction efficiency.

The present disclosure discloses a GaN-based HBLED with dual reflecting layers, comprising a substrate; an epitaxial layer formed on the substrate that comprises a P-type layer, a light-emitting area and an N-type layer; a current spreading layer formed on the P-type layer; a P electrode on the current spreading layer, wherein, a reflecting structure that comprises an annular reflecting layer and a metal reflecting layer is formed between the P electrode and the epitaxial layer, wherein, the geometric center vertically corresponds to the P electrode; the annular reflecting layer is formed between the current spreading layer and the P-type layer; the metal reflecting layer is formed between the current spreading layer and the P electrode; and preset distance is arranged between the annular reflecting layer and the metal reflecting layer.

The annular reflecting layer is on part of the P-type layer and is composed of an annular structure with shape consistent with that of the P electrode.

The annular width of the annular reflecting layer is 5-50 μm.

The inner diameter of the annular reflecting layer is 30-200 μm.

The outer diameter of the annular reflecting layer is 50-300 μm.

The diameter of the metal reflecting layer is 50-200 μm.

The preset distance between the annular reflecting layer and the metal reflecting layer is 2-10 μm.

The thickness of the annular reflecting layer is 0.5-5 μm.

The annular reflecting layer is a DBR or an ODR (Omni Directional Reflector).

The annular reflecting layer is made from alternating high and low reflective index material layers. The high refractive index layer is selected from TiO, $TiO_2$, $Ti_3O_5$, $Ti_2O_3$, $Ta_2O_5$, $ZrO_2$ or any of their combination. The low reflective index layer is selected from $SiO_2$, $SiN_x$, $Al_2O_3$ or any of their combination.

The metal reflecting layer can be Al, Ag or Ni.

The substrate can be sapphire ($Al_2O_3$), silicon carbide (SiC) or silicon wafer (Si).

The current spreading layer material can be Ni/Au alloy, Ni/ITO alloy, ITO, ZnO or In-mixed ZnO, Al-mixed ZnO, Ga-mixed ZnO or their combination.

Compared with conventional technologies, the embodiments of the present disclosure may have advantages including: (1) an annular reflecting layer and a metal reflecting layer are added between the LED epitaxial layer and the P electrode, forming a dual reflecting layer structure, which extracts part of light emitted from the light-emitting layer sideways through the primary reflection of the annular reflecting layer and extracts the light that originally to be emitted to the P electrode upwards through the dual layer reflection of the dual reflecting layer, thus improving the light extraction efficiency of the chip; (2) the annular reflecting layer also blocks the current and eliminates the current accumulation beneath the chip electrode, thus further improving the chip light-emitting efficiency; and (3) the sectional area of the annular reflecting layer is controlled to be consistent with that of the P electrode based on the chip size and electrode distribution, making proportion of light (emitted from the light-emitting layer) extracted upwards and sideways adjustable, thus improving uniform distribution of light emitted from the chip.

The accompanying drawings, which are included to provide a further understanding of the invention and constitute a part of this specification, together with the embodiments, are therefore to be considered in all respects as illustrative and not restrictive. In addition, the drawings are merely illustrative, which are not drawn to scale.

Figure 1:
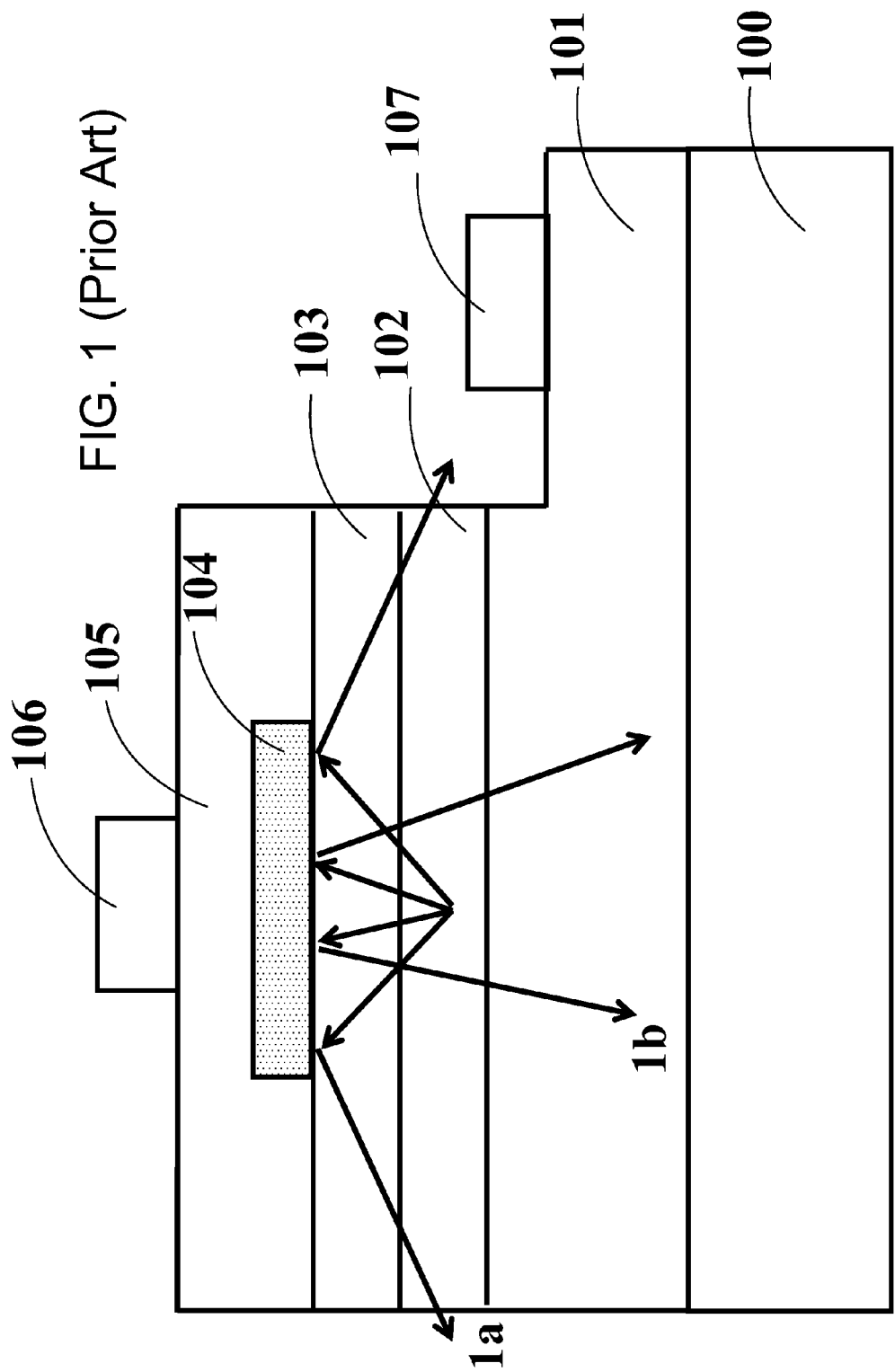
FIG. 1 is a structural diagram of a conventional LED.

100: substrate; 101: N-type layer; 102: light-emitting area; 103: P-type layer; 104: metal reflecting layer; 105: current spreading layer; 106: P electrode; 107: N electrode; 200: substrate; 201: N-type layer; 202: light-emitting area; 203: P-type layer; 204: annular reflecting layer; 205: current spreading layer; 206: metal reflecting layer; 207: P electrode; 208: N electrode; 209: P-extension electrode; 210: long-stripe annular structure.

DETAILED DESCRIPTION

The embodiments of the present disclosure will be described in detail with reference to the accompanying drawings and examples, to help understand and practice the disclosed embodiments, regarding how to solve technical problems using technical approaches for achieving the technical effects. In specific device design and manufacture, the LED structures according to the present disclosure will be adjusted and changed in terms of structure and dimension to some extent and the material selection based on specific application fields and process applications.

The embodiments provide a GaN-based high-brightness LED with dual reflecting layers, comprising a substrate; an epitaxial layer, a current spreading layer, a reflecting structure, a P electrode and an N electrode.

More specifically, the substrate can be sapphire ($Al_2O_3$), silicon carbide (SiC) or silicon wafer (Si). Insulation material is applied for horizontal LED devices and conductive material for vertical LED devices.

The epitaxial layer can be formed on the substrate surface through epitaxial growth, comprising at least an N-type layer, a light-emitting layer and a P-type layer from the bottom up, also comprising a buffer layer and an electron blocking layer. The material is GaN-based semiconductor layer.

The current spreading layer, formed on the P-type layer, can be Ni/Au alloy, Ni/ITO alloy, ITO, ZnO or In-mixed ZnO, Al-mixed ZnO, Ga-mixed ZnO or their combination.

The P electrode is formed on the electrode extension layer and is used for providing current injection for the light-emitting layer. For horizontal LED device, P-type layer and the light emitting layer can be partially etched to expose the N-type layer. The N electrode is formed on the exposed N-type layer surface. For the vertical LED device, the N electrode is formed on the back of the conductive substrate.

The reflecting structure is between the P electrode and the P-type layer and comprises an annular reflecting layer and a metal reflecting layer. The position and size of the reflective structure can be determined based on the shape and position of the P electrode, the geometric center vertically corresponding to the P electrode center. The annular reflecting layer is formed between the current spreading layer and the P-type layer, inside the bottom layer of the current spreading layer or the top surface layer of the epitaxial layer, comprising at least one annular structure, the shape may be circular, square, triangle or regular polygon. The parameters for annular structure of the annular reflecting layer can be adjusted and designed based on chip size and specific optical path. In some embodiments, the annular width of the annular reflecting layer can be 5-50 μm, the inner diameter can be 30-200 μm, the outer diameter can be 50-300 μm and the thickness can be 0.5-5 μm. In some preferred embodiments, the DBR or the ODR serves as the annular reflecting layer, which also blocks the current and eliminates the current accumulation beneath the chip electrode, thus further improving the chip light-emitting efficiency. A metal reflecting layer is formed on the current spreading layer and locates between the current spreading layer and the P electrode, can be inside or on the current spreading layer, with vertical distance to the annular reflecting layer of 2-10 μm. The material can be Al, Ag or Ni.

In the following, detailed descriptions will be given in combination with Embodiments 1-3 with reference to FIGS. 2-6.

Embodiment 1

Figure 2:
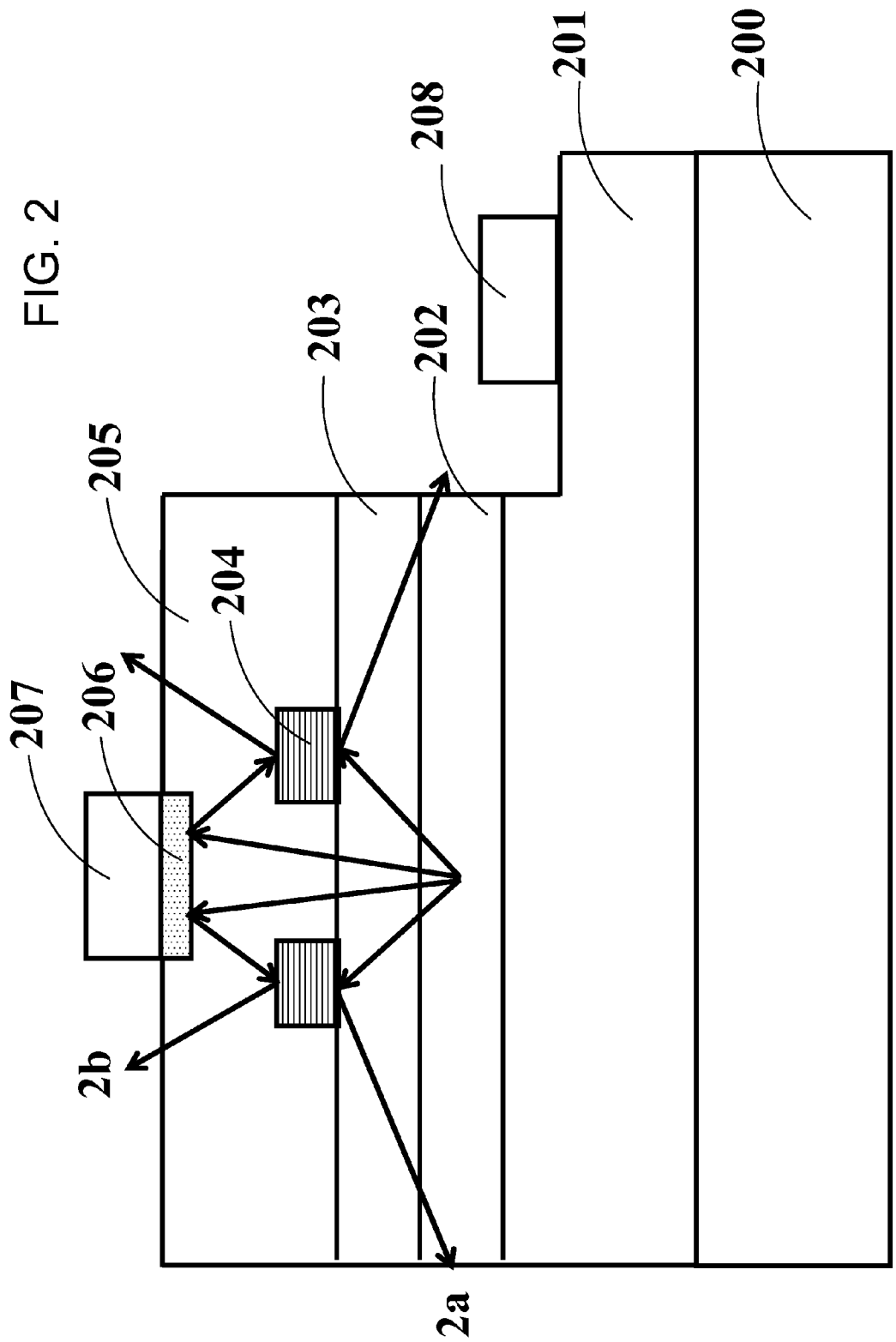
FIG. 2 is a cross sectional view of a GaN-based HBLED with dual reflecting layers disclosed in Embodiment 1.
Figure 3:
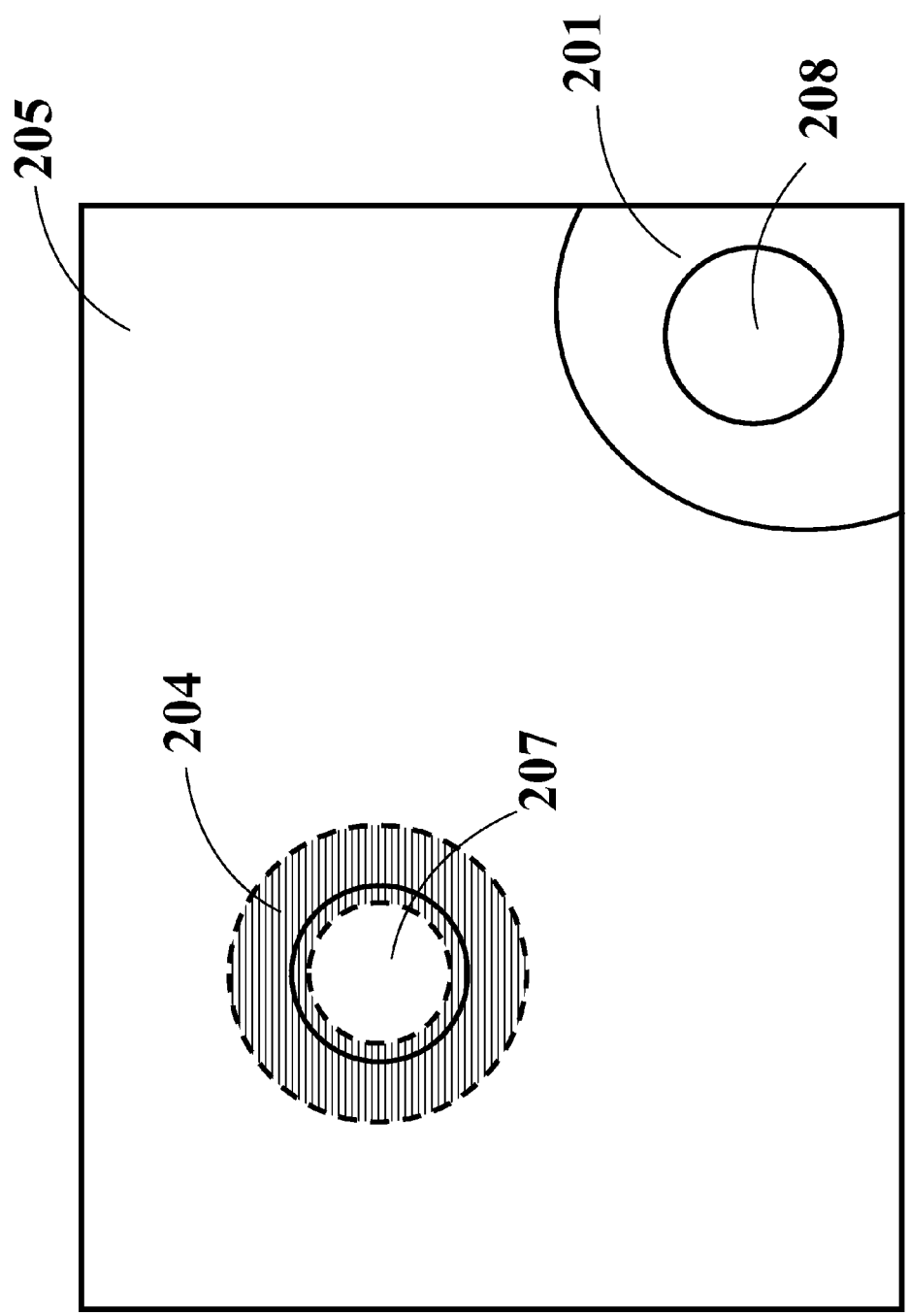
FIG. 3 is a top view of a GaN-based HBLED with dual reflecting layers disclosed in Embodiment 1.
Figure 4:
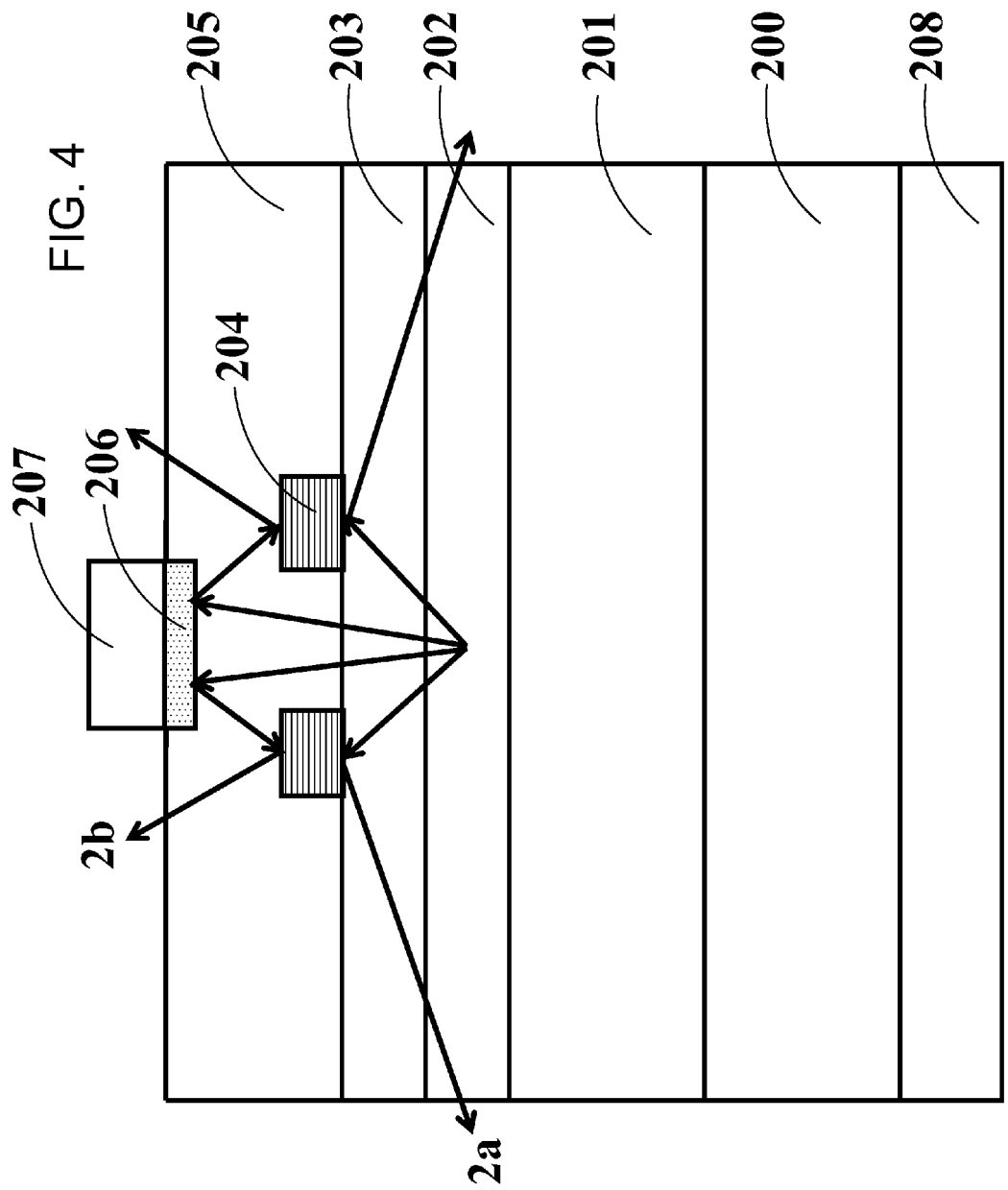
FIG. 4 is a cross sectional view of a GaN-based HBLED with dual reflecting layers disclosed in Embodiment 2.
Figure 5:
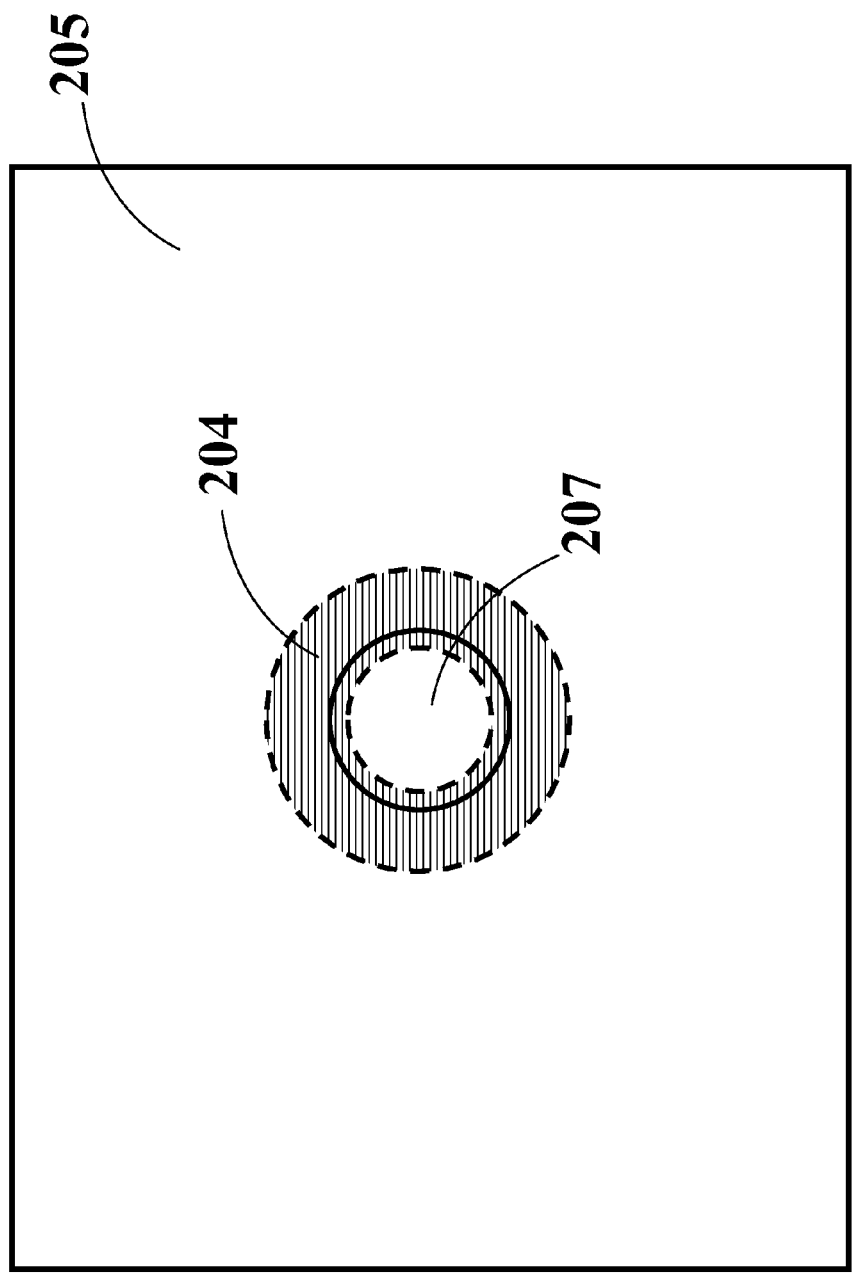
FIG. 5 is a top view of a GaN-based HBLED with dual reflecting layers disclosed in Embodiment 2.
Figure 6:
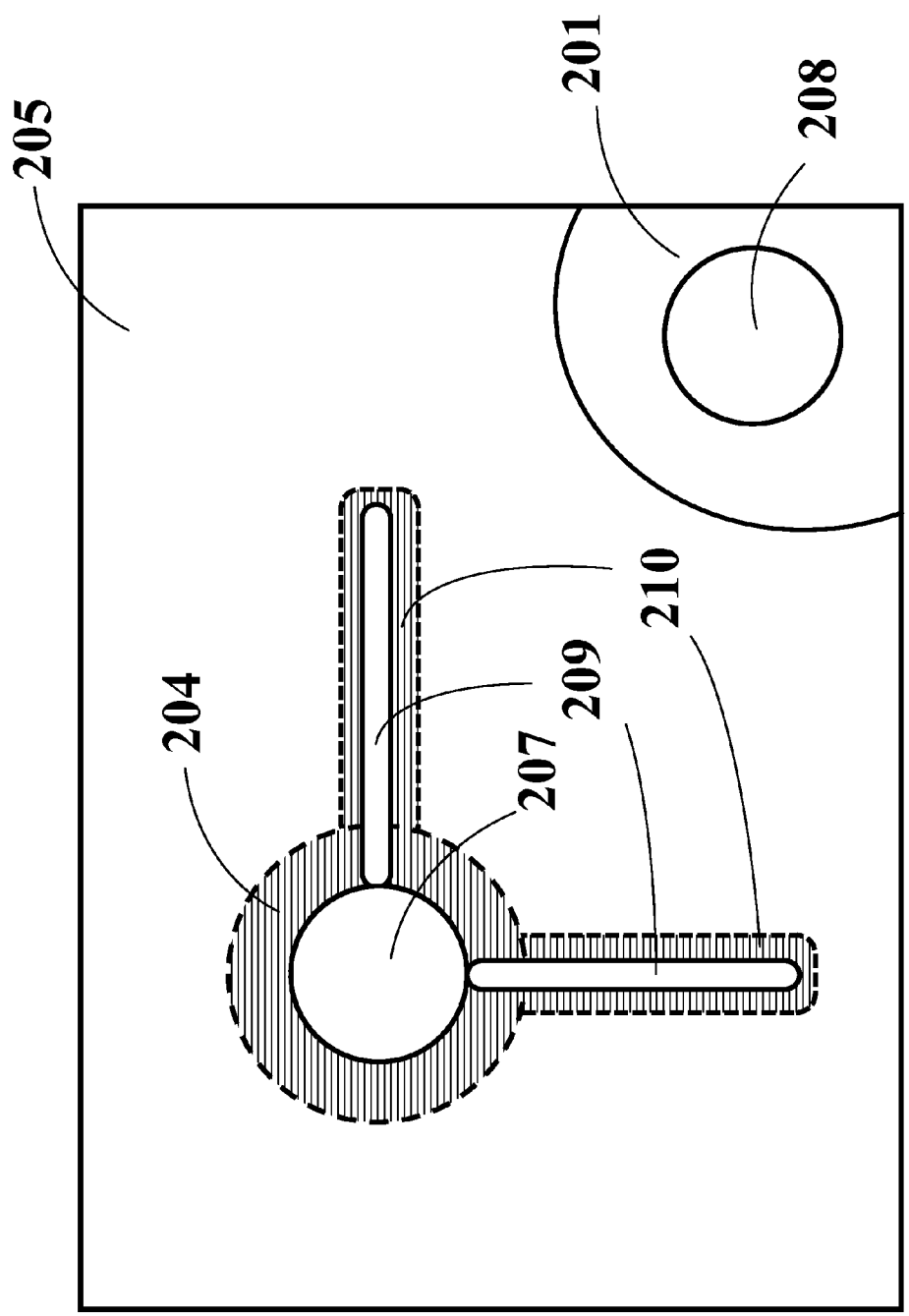
FIG. 6 is a top view of a GaN-based HBLED with dual reflecting layers disclosed in Embodiment 3.

As shown in FIGS. 2-3, a GaN-based HBLED with dual reflecting layers, comprising a sapphire substrate 200, an N-type layer 201, a light-emitting area 202, a P-type layer 203, an annular DBR 204, a current spreading layer 205, a metal reflecting layer 206, a P electrode 207 and an N electrode 208.

More specifically, the LED structure has a sapphire substrate 200 at the bottom; an N-type layer 201, formed on the sapphire substrate 200; a light-emitting area 202, formed on the N-type layer 201; a P-type layer 203, formed on the light-emitting area 202; an annular DBR 204, formed on the P-type layer 203; an ITO current spreading layer 205, formed on the annular DBR 204 and the P-type layer 203 surface; an Al metal reflecting layer 206, formed on the surface layer of the ITO current spreading layer 205; a P electrode 207, formed on the Al metal reflecting layer 206; an N electrode 208, formed on the exposed N-type layer 201; wherein, the DBR 204 comprises alternating high refractive index $TiO_2$ material and low refractive index $SiO_2$ material; inner diameter of the annular DBR 204 is 80 μm; outer diameter of the annular DBR 204 is 130 μm; and diameter of the metal reflecting layer 206 is 85 μm.

The reflecting structure of the embodiment has the characteristics that: (1) the metal reflecting layer vertically corresponds to the DBR center; (2) inner diameter of the annular DBR 204 is smaller than the diameter of the metal reflecting layer 206, and the outer diameter of the annular DBR 204 is larger than the diameter of the metal reflecting layer 206; and (3) the diameter of the metal reflecting layer 206 equals to diameter of the P electrode 207. An annular DBR 204 and an Al metal reflecting layer 206 are added between the LED P-type layer 203 and the P electrode 207, forming a dual reflecting layer structure, as shown in Light 2a path, which extracts part of light emitted from the light-emitting layer sidewards through the primary reflection of the annular DBR 204 and extracts the light that originally to be emitted to the P electrode 207 upwards through the dual layer reflection of the dual reflecting layer, as shown in Light 2b path, thus improving the light extraction efficiency of the chip.

A fabrication method for a GaN-based LED of dual reflecting layer structure, comprising:

First step: epitaxially growing a GaN-based light-emitting epitaxial layer on the sapphire substrate 200, comprising an N-type layer 201, a light-emitting area 202 and a P-type layer 203;

Second step: forming an annular DBR 204 on the P-type layer 203 through evaporation;

Third step: forming an ITO current spreading layer 205 on the annular DBR 204 and the P-type layer 203 surfaces through evaporation;

Fourth step: forming an Al metal reflecting layer 206 on the ITO current spreading layer 205 through sputtering; and Fifth step: fabricating a P electrode 207 and an N electrode 208 at right above of the Al metal reflecting layer 206 and the exposed N-type layer 201 respectively through photomasking and lifting off.

The second step makes the Al metal reflecting layer 206 vertically correspond to the DBR 204 center; and the fifth step makes the metal reflecting layer locate at the right bottom of the P electrode 207 and the Al metal reflecting layer 206 equal to the diameter of P electrode 207.

Embodiment 2

In comparison with Embodiment 1, this embodiment discloses a vertical GaN-based HBLED with dual reflecting layers. In the present embodiment, Si serves as the substrate 200. The N electrode 208 is formed at the back of the substrate and constitutes part of a vertical LED device.

Embodiment 3

In comparison with Embodiment 1, the electrode structure of the GaN-based LED device disclosed in present embodiment also comprises an extension electrode 209 (10 μm wide). A metal reflecting layer and an annular reflecting layer can be set at the right bottom of the extension electrode. The metal reflecting layer can be equal to the extension electrode. The annular reflecting layer is composed of an annular structure 204 under the P electrode 207 and a long-stripe annular structure 210 under the extension electrode 209. The difference between the annular structure 204 and that disclosed in Embodiment 1 is that: inner diameter of the annular DBR 204 is 80 μm, equal to the P electrode 207, and the inner diameter of the long-stripe annular structure 210 is 10 μm, and the outer diameter is 20 μm.

The invention claimed is:

1. A GaN-based LED, comprising:
 a substrate;
 an epitaxial layer formed over the substrate and comprising a P-type layer, a light-emitting area and an N-type layer;
 a current spreading layer formed over the P-type layer;
 a P electrode over the current spreading layer,
 wherein a reflecting structure that comprises an annular reflecting layer and a metal reflecting layer is formed between the P electrode and the epitaxial layer, and has a geometric center vertically corresponding to the P electrode to allow light emitted toward the P electrode be reflected by the metal reflecting layer toward a first side of the annular reflecting layer;
 wherein:
  the annular reflecting layer is formed between the current spreading layer and the P-type layer;
  the metal reflecting layer is formed between the current spreading layer and the P electrode; and
  a distance is preset between the annular reflecting layer and the metal reflecting layer.

2. The GaN-based LED of claim 1, wherein the reflecting structure is underneath the P electrode, and wherein the light emitted toward the P electrode travels through an inner opening of the annular reflecting layer and is reflected by the metal reflecting layer toward the first side of the annular reflection layer for further reflection toward an outside of the LED.

3. The GaN-based LED of claim 1, wherein the annular reflecting layer is over a portion of the P-type layer and comprises an annular structure with a shape consistent with that of the P electrode to thereby improve light extraction efficiency.

4. The GaN-based LED of claim 1, wherein the annular reflecting layer is a DBR or an ODR, and has a second side configured to facilitate extraction of light sideways from the LED with a single reflection.

5. The GaN-based LED of claim 1, wherein the annular reflecting layer is underneath the metal reflecting layer, wherein an inner diameter of the annular reflecting layer is less than or equal to a diameter of the metal reflecting layer, and an outer diameter of the annular reflecting layer is larger than the diameter of the metal reflecting layer.

6. The GaN-based LED of claim 1, wherein an annular width of the annular reflecting layer is 5-50 μm.

7. The GaN-based LED of claim 1, wherein an inner diameter of the annular reflecting layer is 30-200 μm.

8. The GaN-based LED of claim 1, wherein an outer diameter of the annular reflecting layer is 50-300 μm.

9. The GaN-based LED of claim 1, wherein a diameter of the metal reflecting layer is 50-200 μm.

10. The GaN-based LED of claim 1, wherein the preset distance between the annular reflecting layer and the metal reflecting layer is 2-10 μm.

11. The GaN-based LED of claim 1, wherein a thickness of the annular reflecting layer is 0.5-5 μm.

12. A system comprising a plurality of GaN-based LEDs, each LED comprising:
 a substrate;
 an epitaxial layer formed over the substrate and comprising a P-type layer, a light-emitting area and an N-type layer;
 a current spreading layer formed over the P-type layer;
 a P electrode over the current spreading layer,
 wherein a reflecting structure that comprises an annular reflecting layer and a metal reflecting layer is formed between the P electrode and the epitaxial layer, and has a geometric center vertically corresponding to the P electrode to allow light emitted toward the P electrode be reflected by the metal reflecting layer toward a first side of the annular reflecting layer;
 wherein:
  the annular reflecting layer is formed between the current spreading layer and the P-type layer;
  the metal reflecting layer is formed between the current spreading layer and the P electrode; and
  a distance is preset between the annular reflecting layer and the metal reflecting layer.

13. The system of claim 12, wherein the reflecting structure is underneath the P electrode, and wherein the light emitted toward the P electrode travels through an inner opening of the annular reflecting layer and is reflected by the metal reflecting layer toward the first side of the annular reflection layer for further reflection toward an outside of the LED.

14. The system of claim 12, wherein the annular reflecting layer is over a portion of the P-type layer and comprises an annular structure with shape consistent with that of the P electrode to thereby improve light extraction efficiency.

15. The system of claim 12, wherein the annular reflecting layer is a DBR or an ODR, and has a second side configured to facilitate extraction of light sideways from the LED with a single reflection.

16. The system of claim 12, wherein the annular reflecting layer is underneath the metal reflecting layer, wherein an inner diameter of the annular reflecting layer is less than or equal to a diameter of the metal reflecting layer, and an outer diameter of the annular reflecting layer is larger than the diameter of the metal reflecting layer.

17. The system of claim 12, wherein an annular width of the annular reflecting layer is 5-50 μm.

18. The system of claim 12, wherein an inner diameter of the annular reflecting layer is 30-200 μm.

19. The system of claim 12, wherein an outer diameter of the annular reflecting layer is 50-300 μm.

20. The system of claim 12, wherein a diameter of the metal reflecting layer is 50-200 μm.

\* \* \* \* \*